United States Patent [19]
Doty

[11] Patent Number: 5,325,059
[45] Date of Patent: Jun. 28, 1994

[54] DOR NMR SAMPLE SPINNER

[75] Inventor: F. David Doty, Columbia, S.C.

[73] Assignee: Doty Scientific Inc., Columbia, S.C.

[21] Appl. No.: 858,235

[22] Filed: Mar. 26, 1992

[51] Int. Cl.$^5$ .............................................. G01V 3/00
[52] U.S. Cl. ................................................... 324/321
[58] Field of Search ................ 324/321, 318, 300, 307

[56] References Cited

U.S. PATENT DOCUMENTS

| | | | |
|---|---|---|---|
| 4,254,373 | 3/1978 | Lippmaa et al. | 324/321 |
| 4,456,882 | 1/1982 | Doty | 324/321 |
| 4,557,611 | 8/1984 | Sixsmith | 384/124 |
| 4,739,270 | 6/1986 | Daugaard et al. | 324/321 |
| 4,899,111 | 8/1988 | Pines et al. | 324/321 |
| 4,968,938 | 6/1989 | Pines et al. | 324/321 |
| 4,968,939 | 6/1989 | Pines et al. | 324/321 |
| 5,159,271 | 10/1992 | Llor | 324/321 |

OTHER PUBLICATIONS

"NMR Experiments With a New Double Rotor", Journal of Magnetic Resonance, 89, 297-308 (1990) by Wu et al. (no month).
"High Efficiency Microturbine Technology", Proceedings, IECEC-91, Aug. 1991 by Doty et al.
"A Refrigeration System Incorporating A Low-Capacity, High-Speed, Gas-Bearing Supported Expansion Turbine", Advances in Cryogenic Engineering, vol. 8, 1962 by Mann et al. (no month).
"Double Rotor for Solid-State NMR" by Samoson et al. Rev. Sci. Instrum. 60 (10), Oct. 1989.

*Primary Examiner*—Louis Arana
*Attorney, Agent, or Firm*—Oppedahl & Larson

[57] ABSTRACT

An NMR DOR sample spinner includes an inner-rotor that is driven by a radial-inflow microturbine at each end, supported radially by anti-whirl air bearings, and supported axially by thrust bearings at each end thereof. The DOR spinner further comprises an outer-rotor that houses the inner-rotor bearing and drive nozzles such that the inner-rotor axis is inclined with respect to the axis of the outer-rotor at an angle of typically 30.56°. The outer-rotor is driven by a radial-inflow microturbine at each end, supported radially on anti-whirl air bearings, and supported axially by thrust bearings at each end thereof. The outer-rotor further comprises ceramic bearing races at each end that hold the sample drive nozzles in place. The outer microturbines are screwed to the outer-rotor and hold the bearing races in place. Drive and bearing gas for the inner-rotor is supplied through slip-fit, precision axial tubes at each end of the outer-rotor. The rf magnetization coil surrounds the central region of the outer-rotor, and rf shield rings limit the axial extent of the rf magnetic field.

34 Claims, 3 Drawing Sheets

DOR NMR SAMPLE SPINNER

FIELD OF THE INVENTION

The field of this invention is the measurement of nuclear magnetic resonance (NMR) for the purpose of determining molecular or microscopic structure, and, more particularly, the high resolution NMR measurement of polycrystalline and/or amorphous solids having quadrupolar or second-order interactions using high-speed spinning about two intersecting axes.

BACKGROUND OF THE INVENTION

High-speed sample spinning about an axis, inclined with respect to the external magnetic field at the angle at which the second Legendre polynomial vanishes, has long been used to average out dipolar NMR interactions for improved spectral resolution. This technique is referred to as Magic Angle Spinning (MAS). In U.S. Pat. No. 4,456,882 I disclose a technique for high speed sample spinning using cylindrical, ceramic sample containers with press-fit plastic turbines. Other NMR MAS spinners are disclosed in U.S. Pat. Nos. 4,254,373 and 4,739,270 and the references cited therein. Co-pending U.S. patent application No. 07/607,521,633, now U.S. Pat. No. 5,202, and PCT appl. no. PCT/US91/01225 disclose further significant improvements in gas bearing whirl stabilization, microturbine efficiency, and high-temperature operation.

Pines et al (U.S. Pat. Nos. 4,899,111, 4,968,938, and 4,968,939) have shown that spinning simultaneously about two intersecting axes, specifically the zeros of the second and fourth Legendre polynomials, should be effective in improving the spectral resolution of quadrupolar NMR nuclides. The above patents provide eloquent discussions of the theory. This technique has been called Double Rotation or DOR. The DOR technique is expect, ed to be most effective at high $B_0$—typically 7 T to 18 T—with inner-rotor rotational frequencies above 7 kHz and outer-rotor rotation above 1400 Hz.

Prior-art DOR spinner designs, however, have been largely ineffective. Special cases have shown spectral enhancement, but more often the spectra are actually degraded, compared to MAS techniques, owing to the following:
(1) the presence of a large number of intense, closely spaced sidebands;
(2) inability to achieve stable spinning over the periods of time required for adequate signal averaging or sideband suppression techniques;
(3) poor filling factor and hence low sensitivity;
(4) large NMR background signals; and
(5) limited temperature range.

Moreover, prior art designs typically require many hours of tedious, dynamic balancing for every sample before marginally stable spinning can be achieved. Spinners are then typically not usable for more than several hours before they have been irreparably damaged by wear.

The instant invention offers such substantial performance improvements in each of the above areas as to make the DOR NMR experiment a viable NMR technique. Spinning speeds are more than doubled, thereby greatly reducing the sideband problem. Samples are quickly loaded and easily spun without tedious dynamic balancing. Filling factor is increased. Stable spinning may now be maintained indefinitely, and spinners may be reused hundreds of times. The design permits the use of such materials as may be required to minimize background signals for any nuclide. The instant design can be made of ceramic materials for operation over a wide range of temperatures.

SUMMARY OF THE INVENTION

An NMR DOR sample spinner includes an inner-rotor that is driven by a radial-inflow microturbine at each end, supported radially by anti-whirl air bearings, and supported axially by thrust bearings at each end thereof. The DOR spinner further comprises an outer-rotor that houses the inner-rotor bearing and drive nozzles such that the inner-rotor axis, or first axis, is inclined with respect to the axis of the outer-rotor, or second axis, at an angle of 30.56°. The outer-rotor is driven by a radial-inflow microturbine at each end, supported radially on anti-whirl air bearings, and supported axially by air thrust bearings at each end. The outer-rotor further comprises ceramic bearing races at each end that hold the inner drive nozzles in place. The outer microturbines are screwed to the outer-rotor and hold the bearing races in place. Drive and bearing gas for the inner-rotor is supplied through slipfit, precision axial tubes at each end of the outer-rotor. The rf magnetization coil surrounds the central region of the outer-rotor, and rf shield rings limit the axial extent of the rf magnetic field. The rotating parts are preferably made from low-conductivity, carbon-fiber-reinforced plastics or from partially stabilized zirconia.

BRIEF DESCRIPTION OF THE DRAWINGS

The invention will be described with respect to drawings, of which.

DETAILED DESCRIPTION OF THE PREFERRED EMBODIMENTS

Figure 1:
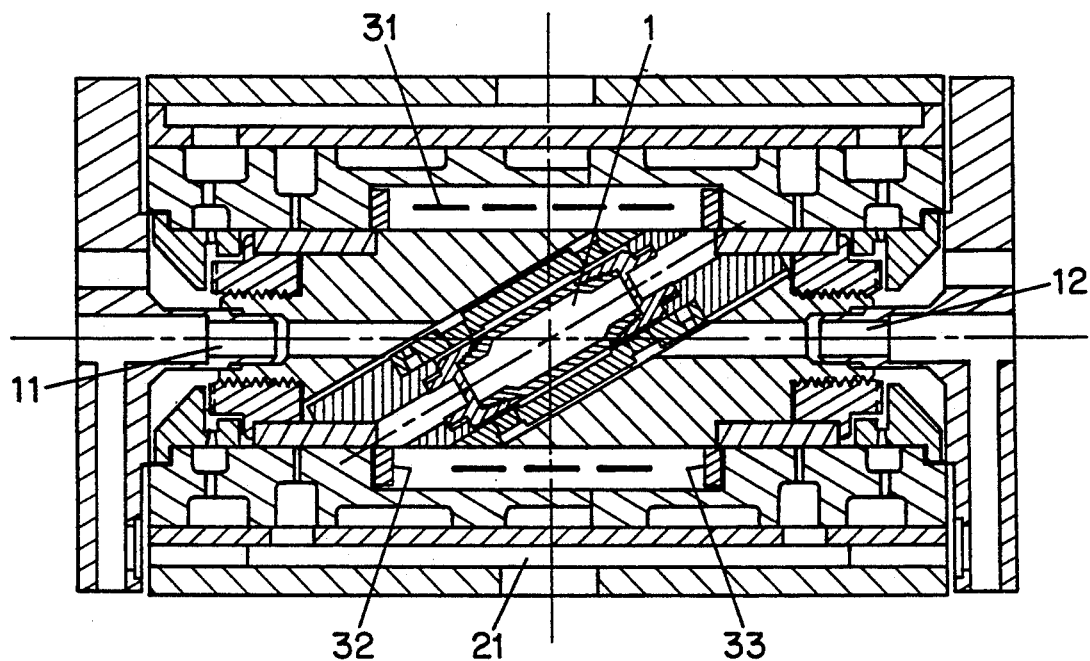
FIG. 1 is a longitudinal cross section of the DOR NMR spinner system.

FIG. 1 is a longitudinal cross section of the DOR spinner assembly according to one embodiment of the instant invention. The sample to be studied by the DOR NMR technique is loaded into a DOR inner-rotor assembly in area 1 at the center of FIG. 1. The inner rotor 100 is within an outer rotor 200.

Figure 2A:
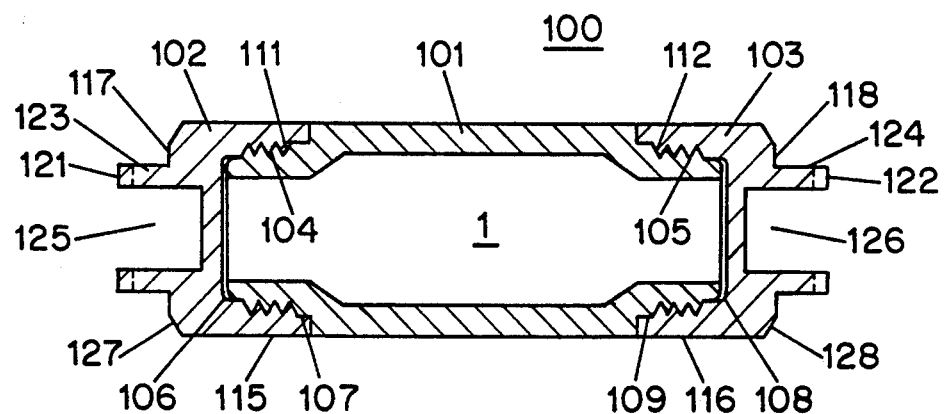
FIG. 2a is a longitudinal cross section and FIG. 2b is an end view of a preferred embodiment of the inner-rotor assembly.

The sample and inner rotor 100 are more easily observed in FIG. 2a, which shows a first preferred embodiment for the abovementioned inner rotor. The sample is located in area 1.

The inner rotor shown in cross section in FIG. 2a has an axis of rotational symmetry extending from left to right in the figure, and the rotor is symmetric from left to right about the vertical plane containing its center-of-mass. Stated differently, the cross section that is shown in FIG. 2a is substantially unaffected by the angle to which the rotor has turned when the section is taken, and the left and right portions of the rotor as shown in FIG. 2a are very nearly mirror images of each other.

Figure 2B:
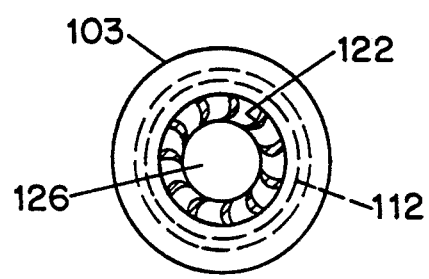

FIG. 2b shows an end view of the inner rotor of FIG. 2a. Turbine blades 122 are shown.

Figure 3A:
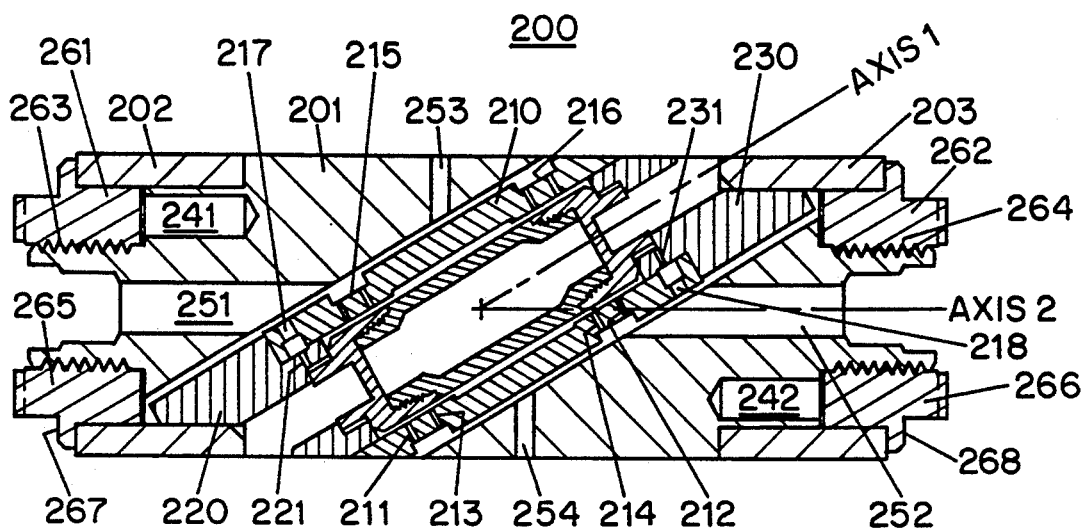
FIG. 3a is a longitudinal cross section.

The inner rotor of FIG. 2a rotates within an outer-rotor assembly shown in FIG. 3a at a predetermined angle as detailed in FIG. 3a in a first preferred embodiment. The center of mass of the inner-rotor lies on the second axis of the outer-rotor but need not be coincident with the center of mass of the outer-rotor.

The first preferred embodiment of the inner-rotor, shown in FIGS. 2a and 2b, is especially well suited to manufacture from composites. The cylindrical sample cell 101 has externally threaded, shouldered regions at each end to accept precision-fit inner turbine caps 102, 103. The inner-rotor assembly of FIG. 2a, which includes the sample 1, the sample cell 101, and the turbine caps 102, 103, has an axial moment of inertia $I_A$ about its axis of symmetry (running from left to right in FIG. 2a), and a transverse moment of inertia $I_T$ about a line perpendicular to its axis and intersecting its center of mass. The symmetry conditions stated earlier dictate that $I_T$ will be independent of the azimuthal angle chosen, that is to say, independent of the arbitrary angle at which a cross section such as that of FIG. 2a is taken.

Wu et al. ("NMR Experiments with a New Double Rotor", J. of Magnetic Resonance, vol 89, pp. 297-309 (1990)) present one method of deriving the governing equations for stable gyroscopic precession. A more intuitive approach is to consider balancing the centrifugal forces (hence, torques) from $I_T$ of the inner-rotor with the forced-precession torque of $I_A$. The value of the latter approach is that it is more immediately clear that only the net torque on the inner-rotor can be canceled. Substantial, unbalanced centrifugal forces remain on every plane along the length of the rotor (radially outward near the ends, inward near the center) but the torques add to zero. Either approach shows that for the desired inner-rotor inclination of 30.56° and for the desired rotational frequency ratio $f_r$ (between 4 and 7) of inner-rotor rotation $f_1$ (Hz) to outer-rotor rotation $f_2$ (Hz), the total moment ratio should be between 5 and 9:

$$5 < I_T/I_A < 9 \qquad (1)$$

More preferably, the desired ratio of $I_T$ to $I_A$ usually lies between 6 and 7, and it should be achieved for sample densities $\rho$ between 1 and 6 g/cc. A frequency ratio $f_r$ of 5 may be satisfied in numerous ways. Two examples are:

(1) a solid cylinder of uniform density with length L and diameter d where L/d=3.07;
(2) a pair of thin disks of uniform density with diameter d symmetrically spaced apart 2L on an axis where L/d=0.89.

For rotational frequencies of 10 kHz, the appropriate outside diameter $d_1$ for the sample cell is approximately 5 mm. The requirement of accommodating several different sample cells for various samples then establishes a minimum practical outer-rotor diameter of approximately 14 mm.

Inner-rotor design optimization includes the following:

(1) maintaining the moment ratio between 6 and 7 over a wide range of sample densities;
(2) achieving maximum practical sample volume;
(3) achieving dimensional tolerances after repeated assembly such that the geometric axis of symmetry lies within 10 microns of the dynamic balance axis;
(4) securing the turbine caps against the large, unbalanced centrifugal forces present on the caps during stable precession;
(5) providing convenient sample loading and removal;
(6) obtaining operation over a wide temperature range;
(7) selecting cell and turbine materials that do not introduce NMR background signals;
(8) allowing relatively easy manufacturability; and
(9) tolerating momentary instabilities without excessive wear.

Partially stabilized zirconia (PSZ, $\rho$ between 5.7 and 6.0, depending on stabilizers) and high-strength silicon nitrides (SN, predominately $Si_3N_4$, $\rho$ between 3.18 and 3.24) have generally been the materials of choice for MAS sample cells for the past three years. The primary applications for DOR will involve studies of $^{27}Al$ and $^{17}O$. Other applications will include $^{23}Na$, $^{14}N$, $^{11}B$, and other quadrupolar nuclides. SN is generally not an acceptable sample cell material because of the minor alumina content required for densification during sintering. PSZ would often be acceptable for the inner-rotor since the natural abundance of $^{17}O$ is only 0.4% and samples could be isotopically enriched, but its high density results in much higher bearing load than plastics or composites during instability. Several plastics are well suited, especially polyetherketone (PEK), polyimides, and polyphthalamide (PPA). Other wear-resistant, high-strength insulating materials may also be used, but fiber-glass-reinforced materials are usually not suitable because of the aluminum and boron content in the fibers. For satisfactory dielectric properties, carbon fiber reinforcement must be kept below 20% in the sample cell and below 12% in larger parts, compared to the 20% to 30% loading typically used for structural purposes. Kevlar reinforcement is usable with thermoplastics such as nylon 6,6 that have low processing temperatures (250° C. compared to 400° C. for PEK); and quartz fibers, though weak compared to other choices, can be beneficial, particularly in increasing the modulus. Polytetrafluoroethylene (PTFE) may be added in amounts of about 5% to 15% for improved wear resistance. In all cases, the composites must be oriented so that direction of major anisotropy, the drawing or compression direction during processing, lies along the axis of the finished part.

Returning to FIG. 2a, precision, ultra-fine, external threads 104, 105 on the ends of the sample cell allow the inner turbine caps 102, 103 to be secured against the typical axial forces of 20 to 100 N and permit convenient access for sample loading and unloading. Right-hand threads are used at one end, and left-hand threads are used at the other end to prevent the caps from unscrewing during instability. Precision alignment and centering of the sample cell 101 is accomplished by means of mating shoulders 106, 107, 108, 109 beyond both ends of the two threaded regions. Suitable, zero-taper (bottoming) threads, preferably with an integer number of turns, may be cut into composites using diamond or carbide tooling precisely enough to eliminate the need for individual dynamic balancing of the empty sample cell. Matching, precision, internal threads 111, 112 are required in the turbine caps. For composites, the static balance axis, dynamic balance axis, and geometric axis of the inner-rotor must be coincident within 20 microns and preferably within 4 microns. Higher precision is required for ceramics.

Prior-art MAS and DOR sample cells utilizing internal threads on the cell and external threads on a solid plug become inconveniently clogged with the sample. Moreover, prior-art solid plug caps with external threads restrict sample volume, and prior-art hollow plug caps with external threads must be packed uniformly before being screwed into the cell.

The outside of the cylindrical body of the internally threaded turbine caps 102, 103 functions as a gas bearing journal 115, 116 at each end of the inner-rotor. Radial-inflow microturbine blades 121, 122 are cut into the end of the turbine cap blisks 123, 124, which extend axially beyond the thrust bearings by typically 1 to 2 mm. The external ends 125, 126 may be hollow or solid, according to sample density and desired moment ratio.

Net axial and radial forces are developed on the inner-rotor during stable precession when the center of mass of the packed inner-rotor does not lie on the axis of the outer-rotor. Sample access at both ends of the inner-rotor is beneficial in obtaining uniformity of the packed sample 1 in the axial direction to assure that the center-of-mass of the inner-rotor coincides with its geometric center. High-capacity thrust bearing annuli 117, 118 at both ends of the rotor are necessary to accommodate residual axial nonuniformity in sample packing. A small external chamfer 127, 128 is generally beneficial in manufacturing.

Figure 3B:
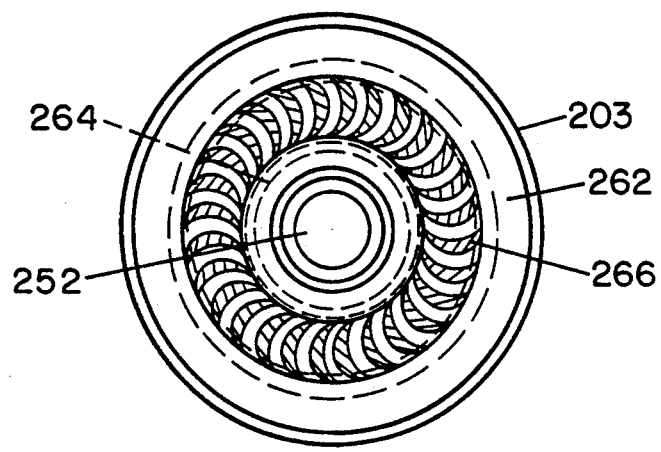
FIG. 3b is an end view along the second axis.
Figure 3C:
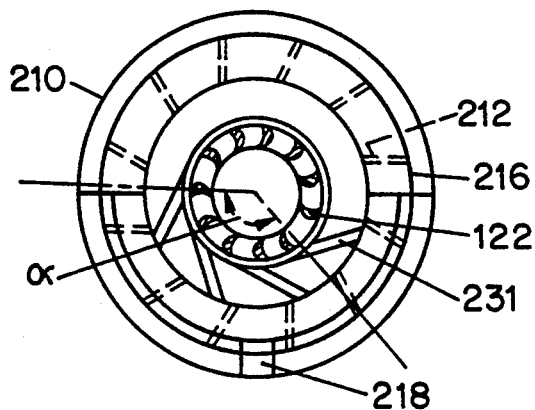
FIG. 3c is a partial view along the first axis of the preferred embodiment of the outer-rotor assembly.

FIGS. 3a, 3b, and 3c provide more detail of the preferred embodiment of the outer-rotor assembly which supports and spins the inner-rotor assembly of FIG. 2a simultaneously about two axes, axis-1 (the "first axis") and axis-2 (the "second axis"). Axis-2, within manufacturing tolerances, is coincident with the aces of the cylinders defined by the external surface of outer-rotor body 201 and the outer-rotor bearing races 202, 203 and is coincident with the static balance axis of rotor body 201. A throughhole, whose axis intersects axis-2 at 30.56°, precisely aligns an inner bearing sleeve 210 and two inner-rotor drive stator caps 220, 230. Axis-1, within manufacturing tolerances, is coincident with the geometric axis of sample cell 101 during operation.

Thrust bearing annuli 117, 118 on the perimeter of the external end of each turbine cap 102, 103, in cooperation with adjacent annular lands 221, 231 on the inner-rotor drive stator caps 220, 230 maintain precise centering of the inner-rotor within the outer-rotor of FIG. 3a in a manner similar to that disclosed in co-pending patent application PCT/US91/01225.

The rotational frequency of the inner-rotor may exceed the product of the rotational frequency of the outer-rotor and $f_r$ by an amount dependent primarily on the load capacity of the inner bearing and the mean density of the inner-rotor. The load capacity of the radial bearing sleeve 210 may be greatly increased by allowing the bearing gas to exhaust over the central portion of the inner-rotor, as discussed in co-pending patent application Ser. No. PCT/US91/01225, through central bearing exhaust or outlet ports 253, 254. In the same co-pending patent application, we also disclose that whirl instabilities may be controlled by injecting the bearing gas with a tangential component opposed to that of the rotor rotation. To do this, the gas bearing orifices are inclined so as to impede the rotation of the inner-rotor. This technique also increases load capacity by a substantial amount at high surface speeds.

Some additional increase in load capacity for the inner bearing sleeve 210 is possible by providing two circumferential rows of bearing holes at each end of the inner-rotor such that the outer bearing row 211, 212 is positioned a distance less than $d_1/3$ from the end of the inner-rotor, and the inner bearing row 213, 214 is positioned a distance less that $d_1/2$ from the outer row.

Axial inlet ports 251, 252 supply pressurized gas to inner bearing supply grooves 215, 216 and inner drive ports 217, 218 for the radial-inflow microturbine nozzles 221, 231. The inner turbines are of the partial-admittance type, with an admittance angle $\alpha$ less than 230°—typically four nozzles subtending an azimuthal angle of about 140° around axis-1, with the two nozzle groups located on opposite sides of axis-1. This permits maximum inner rotor length with simplified drive gas ducts. The relationship between bearing orifices 212, nozzles 231, and turbine blades 122 (see FIG. 2a) is shown in cross section in FIG. 3c.

The preferred material for the sleeve 210 and bearing races 202, 203 is usually partially stabilized zirconia. Polyimide composites lubricated with 5% to 10% teflon offer the advantage of lower density; hence, tolerance limitations result in less dynamic imbalance of the outer-rotor of FIG. 3a but wear resistance and dimensional stability are degraded compared to zirconia.

Dimensional stability and strength of plastic composites may be enhances with carbon fiber preferably of 6% or more, but graphite lubricant is to be avoided as the total carbon content must not exceed 12% for acceptable dielectric properties in the inner-bearing sleeve 210, inner stator caps 220, 230, outer-rotor body 201, and outer-rotor bearing races 202, 203. Higher carbon fiber loading, preferably at least 10% and up to 20%, is permissible in the severely stressed sample cell 101 since its volume is very small.

Additional outer-rotor strength could be provided by preferably more than 5% and less than 25% quartz fiber.

The outer rotor assembly as pictured in FIGS. 3a and 3b has static balance axis coincident with geometric axis, axis-2. That is, in a uniform gravitational field, it will not tend to rotate from any rest position in a frictionless bearing system coincident with its geometric axis unless other external torques are applied. However, it clearly has a large dynamic couple imbalance, except for certain improbable choices of relative densities of the various parts.

High-speed rotation is possible only if the dynamic balance axis is also made to coincide with the geometric axis. Methods of measuring and correcting dynamic imbalance are well known, and the art is widely practiced. For example, if rotor body 201 and stator caps 220, 230 have similar density, dynamic balance could be achieved by drilling suitable balancing holes 241, 242 as shown. If the stator caps 220, 230 are of zirconia and the body is of a plastic composite, balancing holes 241, 242 would need to be plugged with zirconia weights of appropriate size.

Precision tolerances are required so that the inner stator caps 220, 230, inner bearing sleeve 210, and dynamic balancing holes and weights are located with radial repeatability of less than $d_2/200$ for zirconia or $d_2/50$ for composites, but errors less than half that large are preferred. Press-fits are unacceptable for convenience reasons. Precision slip-fits—i.e., positive mean radial clearances less than 8 microns for composites, and less than 4 microns for ceramics—are preferred. The inner stator caps and sleeve are secured by the bearing races 202, 203, which in turn are secured by the outer turbine blisks 261, 262. The outer turbine blisks are internally threaded with a fine, precision thread 263, 264 to match the external, axial threads on the ends of the outer rotor body 201. The turbine blisk and bearing race could be joined as a single part, but this is not usually preferable for manufacturing reasons, especially since different materials would usually be preferred for the race and blisk. Radial-inflow turbine blades 265, 266 are located on the ends of the outer turbine blisks along with outer-rotor thrust bearing annuli 267, 268 for rotation and centering. Disassembly is accomplished by unscrewing an outer turbine blisk, slipping the bearing race off, pulling a stator cap out, removing the inner rotor, and unscrewing an inner turbine cap.

The end of the outer rotor is shown in FIG. 3b, where turbine blades 266 may be seen.

Most of the features of the outer stator as depicted in FIG. 1 are very similar to the prior-art supersonic MAS design, as disclosed in co-pending application PCT/US91/01225. The most significant difference is the requirement of providing pressurized gas through axial injectors 11, 12 into inlet ports 251, 252. This gas may come from the outer-stator bearing supply 21. Also, the rf magnetization coil 31 will usually be somewhat shorter than in MAS owing to the reduced sample dimensions in DOR. Performance at high frequencies may be enhanced somewhat by the addition of copper rf shield-rings 32, 33, shown in FIG. 1, to sharply limit the rf magnetic field beyond the sample region. $B_1$ homogeneity is adversely affected, but Q is greatly enhanced—especially when the outer-rotor body is made from a carbon-filled composite. However, it will often be desirable to replace the DOR outer-rotor with a conventional, cylindrical MAS rotor, according to the prior art, in which case the rf-flux-shorting rings are undesirable.

The low thermal expansion of carbon-fiber-reinforced plastics facilitates operation over a wide temperature range with a combination of zirconia and composites. Temperatures up to 165° C., for example, are possible with carbon-filled PEK for all the inner-rotor, outer-rotor, and outer-stator parts, although the inner bearing sleeve and outer bearing races would generally be of zirconia for wear resistance. Higher temperature operation—up to 250° C.—is possible with a zirconia sample cell while the rest of the parts are still of composites. For even higher temperatures, the entire DOR spinner may be made from zirconia.

Figure 4:
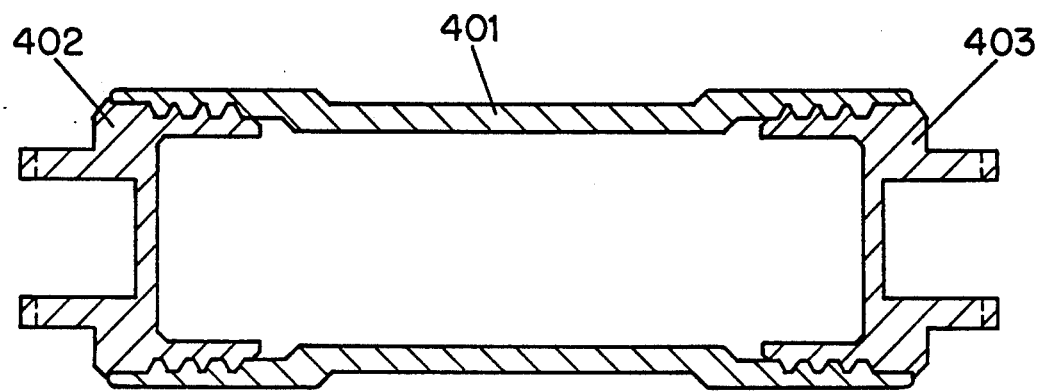
FIG. 4 is a longitudinal cross section of a second preferred embodiment of the inner-rotor assembly.
Figure 5:
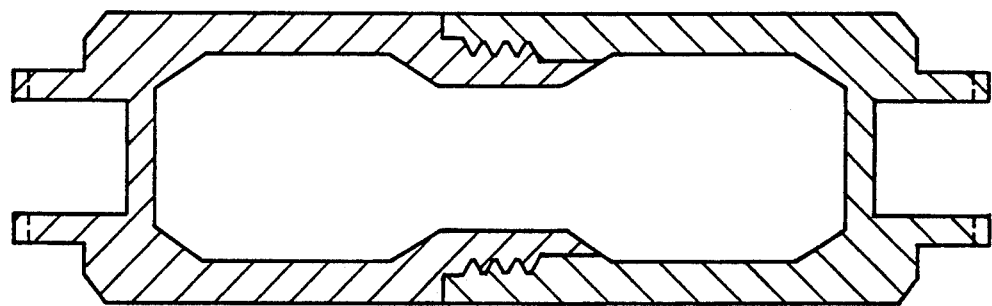
FIG. 5 is a longitudinal cross section of a third preferred embodiment of the inner-rotor assembly.

The low-carbon composites do not have sufficient strength for sample cells for high-density samples even at room temperature unless excessively thick walls are used in the sample cell. FIG. 4 shows an inner rotor design appropriate for a zirconia sample cell 401 with composite inner turbine caps 402, 403. To maintain the proper moment ratio and interchangeability with composite inner-rotors without using zirconia turbine caps, the outside diameter of the zirconia sample cell 401 must be reduced over the central region. For $^{17}O$ studies on high-density samples, sample cell 401 could be made from silicon nitride with a somewhat larger central diameter. For very high temperatures, it becomes necessary to utilize zirconia or silicon nitride turbine caps even though their precision internal threads are very difficult to grind and gage. A zirconia sample cell design according to FIGS. 2a and 2b may be used with zirconia turbine caps. An alternative all-zirconia, two-part sample cell is shown in FIG. 5 that is much easier to manufacture to the required precision (couple imbalance is easily made negligible), but it is more likely to unscrew during instability.

Although this invention has been described herein with reference to specific embodiments, it will be recognized that changes and modifications may be made without departing from the spirit of the present invention. All such modifications and changes are intended to be included within the scope of the following claims.

I claim:

1. A DOR NMR sample spinner for simultaneous rotation of a sample about second and first axes in an external magnetic field comprising:

an outer-rotor having a second axis of static balance, said outer-rotor being asymmetric about said second axis, said outer-rotor containing an inner-rotor;

an outer stator including gas bearings for support of said outer-rotor, drive nozzles to effect rotation of said outer-rotor, a gas distribution manifold, and an rf magnetization coil surrounding said outer-rotor;

said outer-rotor comprising:

outer-rotor drive means at one end of said outer-rotor;

a cylindrical outer-rotor body having a rotational axis coincident with said second axis and having a round through-hole defining a first axis which intersects said second axis at an acute angle;

an inner bearing sleeve in said through-hole and two inner-rotor drive stator caps at respective ends of said through-hole, each with an outside diameter essentially equal to that of said through-hole;

an axial inlet port in said outer-rotor body for supplying pressurized gas to said inner bearing sleeve and stator caps;

an outer bearing race disposed over the outside of each end of said outer-rotor body so as to position and constrain said stator caps;

an outlet port in said outer-rotor body for venting gas from the central region of said inner bearing sleeve;

dynamic balance means such that the dynamic balance axis of said outer-rotor lies within 20 microns of said second axis when said outer-rotor is assembled;

said inner-rotor being substantially reflectionally symmetric about a plane containing its center of mass and perpendicular to its rotational axis, said inner rotor being substantially rotationally symmetric about its geometric axis, said geometric axis being coincident with said first axis during operation;

said inner-rotor further characterized in that it includes microturbine blades and two opposed thrust bearing annuli;

said inner stator caps including inner-rotor drive nozzles to cooperate with said microturbine blades, and including thrust bearing annular lands to cooperate with said bearing annuli for rotation and centering of said inner-rotor, such that the center of mass of said inner-rotor lies on the rotational axis of said outer-rotor.

2. The DOR spinner of claim 1 further characterized in that the outer rotor further comprises two symmetrically located partial-admittance radial-inflow microturbines for rotation of said inner rotor.

3. The DOR spinner of claim 1 further characterized in that said outer-rotor drive means is secured to said body by means of external, axial threads on said body.

4. The DOR spinner of claim 1 in which said outer-rotor drive means includes a radial-inflow microturbine blisk.

5. The DOR spinner of claim 1 in which said outer-rotor is symmetric with respect to a rotation of 180 degrees in a plane containing the first and second axes.

6. The DOR spinner of claim 1 in which the acute angle is 30.56 degrees.

7. The DOR spinner of claim 1 in which said inner bearing sleeve includes gas bearing orifices inclined so as to impede the rotation of said inner-rotor.

8. The DOR spinner of claim 1 in which said inner bearing sleeve contains two circumferential rows of bearing holes near each end of said rotor.

9. The DOR spinner of claim 1 in which said outer stator further comprises rf shield-rings a short distance beyond each end of said rf magnetization coil.

10. The DOR spinner of claim 1 in which said inner-rotor comprises an externally threaded sample cell and two inner-rotor turbine caps secured to each end of said cell and maintained in precision colinear alignment by matching shoulders.

11. The DOR spinner of claim 1 in which said inner rotor comprises two short cylinders, each cylinder closed at one end, the cylinders secured together by matching threads at their respective open ends, and maintained in precision colinear alignment by matching shoulders.

12. The DOR spinner of claim 1 in which the mean radial clearance between said bearing race and said outer rotor body is positive and less than 8 microns.

13. The DOR spinner of claim 1 in which said outer bearing race is made from partially stabilized zirconia.

14. The DOR spinner of claim 1 in which said inner-rotor is made from a composite containing at least 10% but not more than 20% carbon fiber.

15. The DOR spinner of claim 1 in which said inner-rotor stator caps are made from a composite that includes at least 5% PTFE.

16. The DOR spinner of claim 1 in which said outer-rotor body is made from a composite containing at least 6% but not more than 12% carbon fiber and more than 5% but less than 25% quartz fiber.

17. The DOR spinner of claim 1 in which said outer bearing race and said outer-rotor drive means are joined to form a drive-bearing cap.

18. The DOR spinner of claim 10 in which each said turbine cap includes an integral number of precision internal threads and one of each said thrust bearing annuli.

19. The DOR spinner of claim 10 in which said sample cell is made from partially stabilized zirconia and has its outside diameter reduced near its center compared to its outside diameter near its ends.

20. The DOR spinner of claim 2 further characterized in that the radial-inflow microturbines are of reduced diameter whereby the bearing annuli are at the full diameter of the inner rotor.

21. An outer-rotor for holding an inner-rotor for use with an DOR NMR sample spinner for simultaneous rotation of a sample about second and first axes in an external magnetic field, said outer-rotor having a second axis of static balance, said outer-rotor being asymmetric about said second axis, said outer-rotor comprising:

outer-rotor drive means at one end of said outer-rotor;

a cylindrical outer-rotor body having a rotational axis coincident with said second axis and having a round through-hole defining a first axis which intersects said second axis at an acute angle;

an inner bearing sleeve and two inner-rotor drive stator caps, each with an outside diameter essentially equal to that of said through-hole;

an axial inlet port in said outer-rotor body for supplying pressurized gas to said inner bearing sleeve and stator caps;

an outer bearing race over the outside of each end of said outer-rotor body so as to position and constrain said stator caps;

an outlet port in said outer-rotor body for venting gas from the central region of said inner bearing sleeve; and dynamic balance means such that the dynamic balance axis of said outer-rotor lies within 20 microns of said second axis when said outer-rotor is assembled.

22. The outer-rotor of claim 21 further characterized in that the outer rotor further comprises two symmetrically located partial-admittance radial-inflow microturbines for rotation of said inner rotor.

23. The outer-rotor of claim 21 further characterized in that said outer-rotor drive means is secured to said body by means of external, axial threads on said body.

24. The outer-rotor of claim 21 in which said outer-rotor drive means includes a radial-inflow microturbine blisk.

25. The outer-rotor of claim 21 in which said outer-rotor is symmetric with respect to a rotation of 180 degrees in a plane containing the first and second axes.

26. The outer-rotor of claim 21 in which the acute angle is 30.56 degrees.

27. The outer-rotor of claim 21 in which said inner bearing sleeve includes gas bearing orifices inclined so as to impede the rotation of said inner-rotor.

28. The outer-rotor of claim 21 in which said inner bearing sleeve contains two circumferential rows of bearing holes near each end of said rotor.

29. The outer-rotor of claim 21 in which the mean radial clearance between said bearing race and said outer rotor body is positive and less than 8 microns.

30. The outer-rotor of claim 21 in which said outer bearing race is made from partially stabilized zirconia.

31. The outer-rotor of claim 21 in which said inner-rotor stator caps are made from a composite that includes at least 5% PTFE.

32. The outer-rotor of claim 21 in which said outer-rotor body is made from a composite containing at least 6% but not more than 12% carbon fiber and more than 5% but less than 25% quartz fiber.

33. The outer-rotor of claim 21 in which said outer bearing race and said outer-rotor drive means are joined to form a drive-bearing cap.

34. The outer-rotor of claim 22 further characterized in that the radial-inflow microturbines are of reduced diameter whereby the bearing annuli are at the full diameter of the inner rotor.

* * * * *